United States Patent [19]

Kase

[11] Patent Number: 5,198,780
[45] Date of Patent: Mar. 30, 1993

[54] ADJUSTABLE GAIN DIFFERENTIAL AMPLIFIER

[75] Inventor: Kiyoshi Kase, Tokyo, Japan

[73] Assignee: Motorola, Inc., Schaumburg, Ill.

[21] Appl. No.: 870,750

[22] Filed: Apr. 20, 1992

Related U.S. Application Data

[63] Continuation of Ser. No. 696,064, May 6, 1991, abandoned.

[30] Foreign Application Priority Data

May 28, 1990 [JP] Japan ................................ 2-139333

[51] Int. Cl.[5] .......................... H03F 3/45; H03G 3/30
[52] U.S. Cl. ..................................... 330/254; 330/253
[58] Field of Search ................................ 330/253, 254

[56] References Cited

U.S. PATENT DOCUMENTS

| 3,803,505 | 4/1974  | Ishigaki et al. | 330/254 |
| 3,968,453 | 7/1976  | Hongu et al.    | 330/254 |
| 4,065,725 | 12/1977 | Lillis et al.   | 330/254 |
| 4,746,875 | 5/1988  | O'Leary         | 330/253 |

FOREIGN PATENT DOCUMENTS

| 1286123 | 1/1969 | Fed. Rep. of Germany | 330/254 |
| 6513    | 1/1981 | Japan                | 330/254 |
| 66510   | 4/1985 | Japan                | 330/254 |

OTHER PUBLICATIONS

"Bifet Variable Gain Amplifier", *IBM Technical Disclosure Bulletin*, vol. 29, No. 11, Apr. 1987, p. 4840.

Primary Examiner—James B. Mullins
Attorney, Agent, or Firm—Michael D. Bingham

[57] ABSTRACT

A differential amplifier avoids gain fluctuations due to process differences and changes in temperature and allows adjustability of the gain and associated frequency characteristics to desired gain values. The amplifier comprises a pair of load transistors coupled to a pair of differential input transistors. A pair of biased current source transistors assure a constant current through the differential transistors, and a pair of bias transistors supply a constant bias to the source of the load transistors. The gain is varied by varying the voltage supplied to the gates of the two load transistors. The voltage supplied to the load transistors is varied by varying the current supplied through a second pair of bias transistors. A number of current source transistors coupled in parallel vary the voltage through the second pair of bias transistors.

4 Claims, 2 Drawing Sheets

ADJUSTABLE GAIN DIFFERENTIAL AMPLIFIER

This application is a continuation of prior application Ser. No. 07/696,064, filed May 6, 1991, and now abandoned.

BACKGROUND OF THE INVENTION

This invention relates, in general, to adjustable gain differential amplifiers, and more specifically, to an adjustable gain differential amplifier which supplies high gain having high stability over a wide bandwidth.

Designers of differential amplifiers recognize that the gain of the amplifiers is not readily adjusted to a fixed value. To obtain a fixed gain and preferred frequency characteristics, the differential amplifier is commonly coupled to a feedback circuit, or to another device which supplies the desired gain. For example, U.S. Pat. No. 4,881,044 issued Nov. 14, 1991 to Kinoshita, et al., teaches a device having a current source supplying a current bias coupled in parallel with a load resistor of a differential amplifier. The gain is set by increasing the transconductance of the current source.

Even with the device taught in the '044 patent, the gain is not readily altered, and cannot independently be set at a desired gain. Since each current source and load resistor posses different temperature characteristics (i.e. coefficients of expansion) and are process dependent, temperature changes and process changes can result in gain fluctuations.

SUMMARY OF THE INVENTION

A differential amplifier, according to the present invention, avoids gain fluctuations due to process differences and changes in temperature and allows adjustability of the gain and associated frequency characteristics to desired gain values. The amplifier comprises a pair of load transistors coupled to a pair of differential input transistors. A pair of biased current source transistors assure a constant current through the differential transistors, and a pair of bias transistors supply a constant bias to the source of the load transistors. The gain is varied by varying the voltage supplied to the gates of the two load transistors. The voltage supplied to the load transistors is varied by varying the current supplied through a second pair of bias transistors. A number of current source transistors coupled in parallel vary the voltage through the second pair of bias transistors.

The above and other objects, features, and advantages of the present invention will be better understood from the following detailed description taken in conjunction with the accompanying drawings.

Figure 4:
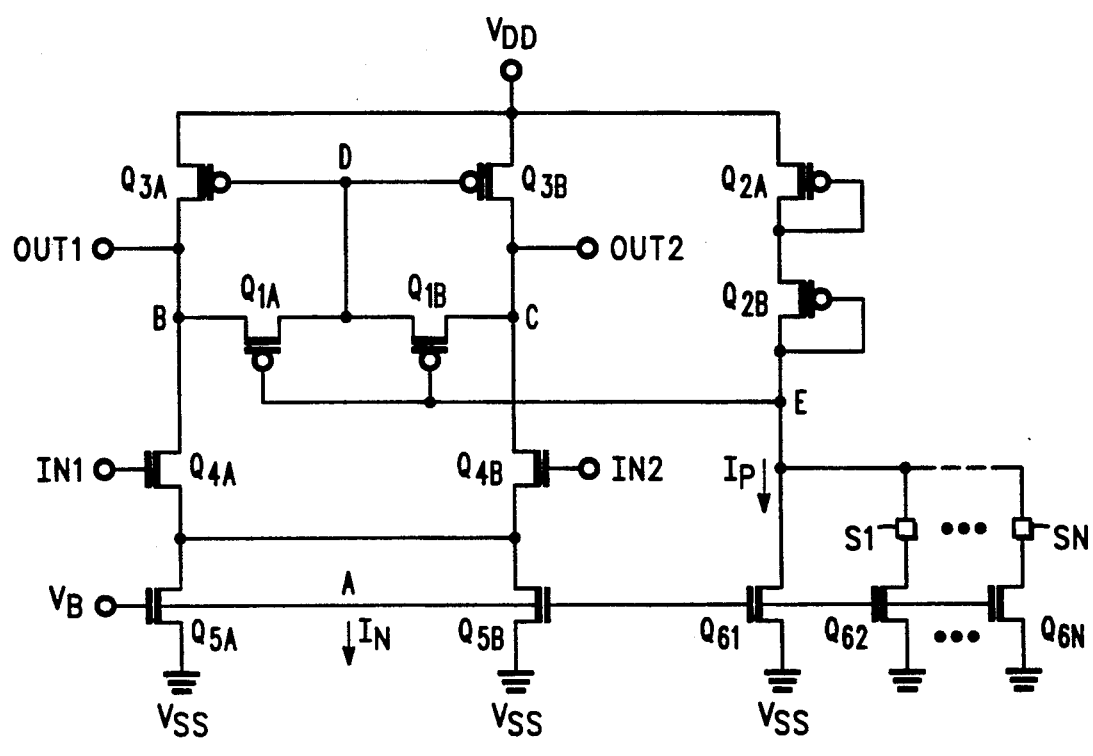
FIG. 4 is a diagram of the present invention in its preferred embodiment.

Table 1 shows the results of a simulation of the circuit of FIG. 4.

DETAILED DESCRIPTION OF THE INVENTION

One having ordinary skill in the art of circuit design will recognize that the gain of a differential comparator or differential amplifier is given by $g_m = i_{out}/\Delta v$. Change in either i or v will result in a change in gain $g_m$. The present invention maintains a constant i while varying the voltage v to change gain.

Figure 1:
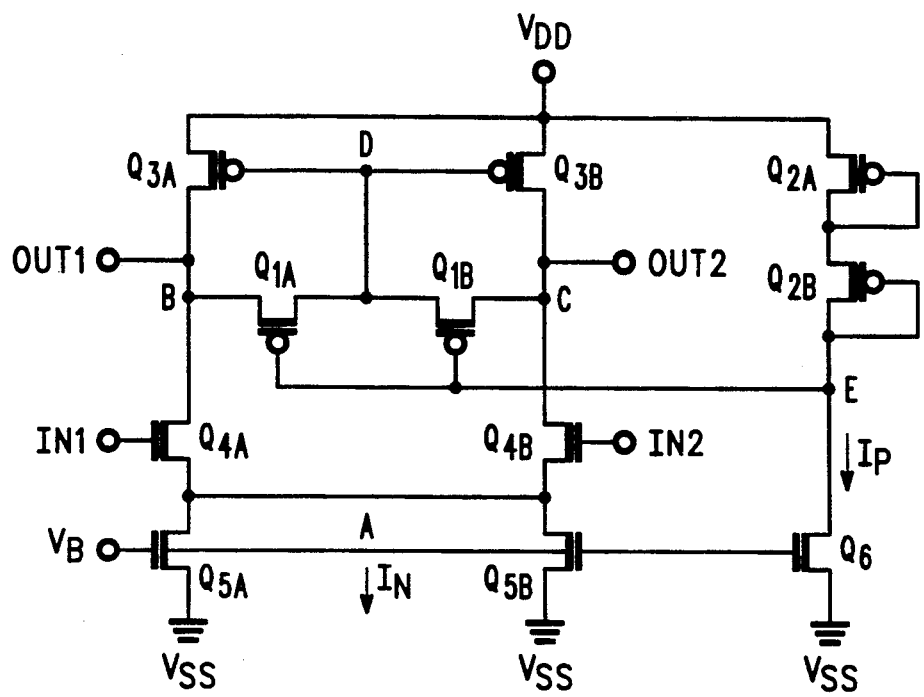
FIG. 1 is a diagram of a basic circuit according to the present invention.

FIG. 1 shows the basic diagram of a gain control differential amplifier 10 according to the present invention. Differential amplifier 10 generally comprises differential transistors Q4A and Q4B (N channel), load transistors Q1A and Q1B (P channel), first bias transistors Q3A and Q3B (P channel), first current source transistors Q5A and Q5B (N channel), second bias transistors Q2A and Q2B, and second current source transistor Q6.

The gates of Q3A and Q3B are coupled to node D common to transistors Q1A and Q1B, and Q3A and Q3B are further coupled in parallel to a power source $V_{DD}$. Q3A, Q1A, and the drain of Q4A are coupled to node B, whereas Q3B, Q1B, and the drain of Q4B are coupled to node C. A first output (OUT 1) is coupled to node B, and a second output (OUT 2) is coupled to node C. The gate of Q4A is coupled to a first input (IN1) and the gate of Q4B is coupled to a second input (IN2).

Transistors Q5A and Q5B operate as voltage controlled current sources and are common to node A. The sources of Q4A and Q4B are coupled to node A. Transistors Q5A and Q5B are controlled by bias $V_B$ (a fixed bias) which maintains a constant current $I_N$ through Q4A and Q4B. Transistors Q5A and Q5B are coupled to ground or $V_{SS}$.

Second bias transistors Q2A and Q2B are coupled in series between $V_{DD}$ and transistor Q6. Transistor Q6 is coupled to ground or $V_{SS}$. Transistors Q1A and Q1B are coupled in parallel to second bias transistor Q2B at node E.

As shown in FIG. 1, a current $I_P$ flows through transistors Q2A and Q2B to transistor Q6. Transistor Q6 is the current source of $I_P$. The gate of transistor Q6 is also coupled to bias $V_B$ Current $I_N$ controlled by voltage controlled current source transistors Q5A and Q5B flows from $V_{DD}$, is split between Q3A and Q3B, through Q4A and Q4B, and on through Q5A and Q5B. Because of bias $V_B$, $I_N$ remains constant.

Current $I_P$ generates a voltage, or control voltage, in Q2A and Q2B which is supplied to the gates of Q1A and Q1B from node E. It should be recognized that due to the constant current $I_N$ through Q3A and Q3B, the voltage at node D remains a constant as determined by $V_{DD}$ less losses through Q3A and Q3B. Therefore, gain generated by amplifier 10 is realized by the voltage difference between node D and the gates of Q1A and Q1B, which gain is output at OUT1 and OUT2 respectively.

Figure 2:
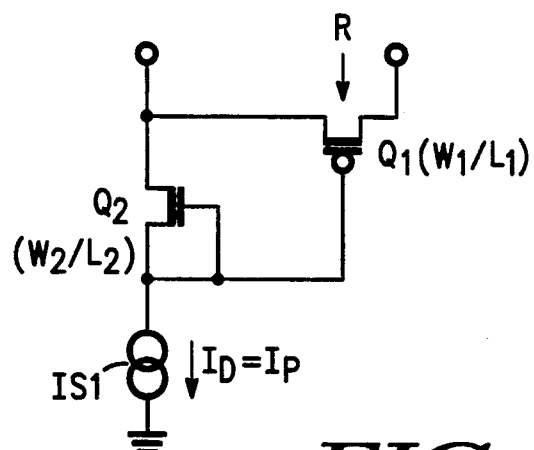
FIG. 2 is a simplified diagram of the circuit of FIG. 1 showing the relationship between the variable resistance of the circuit and the current.
Figure 3:
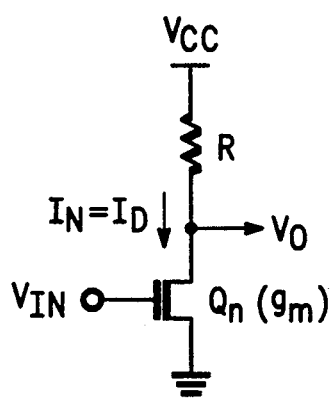
FIG. 3 is a simplified diagram of FIG. 1 showing the relationship between the input voltage and the current.

The gain characteristics and generation are further understood by the following discussion relating to FIGS. 2 and 3.

FIG. 2 shows a schematic of the gain generation. A transistor Q1 of FIG. 2 represents Q1A and/or Q1B of FIG. 1 and has a resistance of R. Q1 has a channel width W1 and a channel length L1. Transistor Q2 represents Q2A and Q2B of FIG. 1 and has a channel width W2 and channel length L2. Current source IS1 corresponds with transistor Q6 of FIG. 1.

In FIG. 2, Q1 functions in a linear region where resistance R can be represented by $$R = \{1/(\mu_p C_{ox})\}\{L1/W1\}\{1/(V_{GS} - V_T)\} \quad (1).$$

In Eq. 1, $\mu_p$ is the mobility of the P channel, $C_{ox}$ is the gate capacity, $V_{GS}$ is the voltage between the gate and source, and $V_T$ is the threshold voltage.

The current $I_D$ is represented by $$I_D = \{\mu_p C_{ox}/2\}\{W2/L2\}\{(V_{GS} - V_T)^2\} \quad (2).$$

A variation of equation (2) is $$\{L2/W2\}\{2/\mu_p C_{ox}\}I_D = \{(V_{GS} - V_T)^2\} \quad (3).$$

Deriving $R^2$ from Eq. 1 and 2 yields $$R^2 = \{1/(\mu_p C_{ox})\}^2 (L1/W1)^2 (W2/L2)\{(\mu_p C_{ox}/2)\}(1/I_D) \quad (4)$$

or $$R^2 = \{1/(2\mu_p C_{ox})\}(L1^2 W2/L2 W1^2)(1/I_D) \quad (5).$$

The first clause in the brackets of Eq. 5 is affected by the manufacturing process of the circuit as well as changes in temperature. The second clause is fixed and unaffected, and the third clause is variable with respect to current flow.

FIG. 3 shows a common amplifier having a load R representing Q1 of FIG. 2, and a transistor $Q_n$. R and $Q_n$ are coupled in series between $V_{CC}$ and ground. The voltage gain $A_v$ of FIG. 3 can be represented as $$A_v = V_0/V_{IN} = g_m R \quad (6)$$

where $g_m$ is the transconductance of $Q_n$ expressed as $$g_m = \{2\mu_N C_{ox}(W/L)I_D\}^{\frac{1}{2}} \quad (7).$$

In Eq. 7, $I_D$ is the drain current that flows to transistor $Q_n$. Accordingly, $$g_m^2 = 2\mu_N C_{ox}(W/L)I_D \quad (8).$$

By applying equations 5, 6, and 8, gain can be defined as $$A_v^2 = g_m^2 R^2 = 2\mu_N C_{ox}(W/L)I_N\{1/(2\mu_p C_{ox})\}\{L1^2 W2/L2 W1^2\}\{1/I_p\} \quad (9).$$

In Equ. 9, current $I_D$ from current source IS1 in FIG. 2 is represented by $I_p$, and $I_D$ from the drain of Q2 of FIG. 3 is represented by $I_N$. Simplifying Eq. 9 yields $$A_v^2 = \{(W/L)(L1^2/W1^2)\}(W2/L2)(\mu_N/\mu_p)(I_N/I_p) \quad (10).$$

The first bracketed portion of Eq. 10 is not affected by temperature or processing. The second clause composed of the mobility quotient may appear to be dependent upon temperature and processing. In actuality, the mobility of N and P type transistors have a tendency to charge at a similar rate when exposed to changes in temperature and changes in the thickness of the gate oxidation membrane. Therefore, the second clause is also a stable value. The current ratio $I_N/I_p$ then determines the gain. This ratio can be readily set to a preferred value from the transconductance ratio of each transistor, or from the size and shape of the transistor. Adjusting $I_N/I_p$ adjusts the gain.

The analysis of FIG. 3 can be applied to FIG. 1. Since Q4A and Q4B correspond to $Q_n$, Q1A and Q1B correspond to Q1 of FIG. 2, and Q2A and Q2B correspond to Q2 of FIG. 2, the gain of circuit 10 in FIG. 1 will closely approximate the gain of Eq. 10.

By adjusting the current ratio $I_N/I_p$, or in other words, by keeping $I_N$ a constant and adjusting $I_p$, the gain can be adjusted to a desired level. Since the ratio $I_N/I_p$ is the ratio of $g_m$ in transistors Q5A, Q5B, and Q6, changes in gain can be facilitated by adjusting the size and shape ratio of transistor Q6 (assuming $I_N$ remains constant).

FIG. 4 shows circuit 10 in its preferred embodiment. As can be seen, circuit 10 in FIG. 4 utilizes a plurality of transistors Q6, or Q61 through Q6n. The source of each Q61 through Q6N is coupled to ground, the gate to $V_B$, and the drains are all common at node E. Interrupt components S1 through Sn are coupled between Q61-Q6n and node E.

Each of Q61-Q6n are constructed with a different size and shape ratio. This allows different amounts of current to flow through each of Q61-Q6n.

Interrupt components S1-Sn can be alternately turned on or off. In this manner, one of Q61-Q6n, or any plurality thereof, may be activated while the other Q61-Q6n are inactivated. As a result, the current $I_p$ flows through only that/those selected Q61-Q6n. Since each of Q61-Q6n allows a different amount of current to flow, S1-Sn can be used to control $I_p$, and therefore the total gain of circuit 10.

In FIG. 4, the drain of each Q61-Q6n is coupled to the respective interrupt component S1-Sn and then to node E. However, other ways of coupling S1-Sn to Q61-Q6n are contemplated by the present invention.

Since an additional current path is provided by Q3A and Q3B, and the drain current of Q4Q and Q4B can be supplied without changing the direct current of nodes B and C, a highly favorable common node rejection ratio is achieved. Node D will attain an average value of the voltage at nodes B and C as a result of the division of transistors Q3A and Q3B, and this relationship will be maintained despite a change in the input voltages IN1 and IN2.

The load of Q4A and Q4B represents a completely balanced circuit. Therefore, transistors Q1A and Q1B operate completely in the linear region, and direct current will not flow into Q1A and Q1B. The balanced circuit further provides very low levels of distortion and low offset voltages.

From Eq. 10 it is apparent that only $I_p$ changes the gain in circuit 10. Further, since the expressions on the right side of Eq. 10 are configured in accordance with the ratio of identical parameters, the current ratio $I_N/I_p$ of the transistors for the P channel and the N channel are configured to not affect the gain. With gain in circuit 10 not dependent upon temperature and processing, circuit 10 becomes extremely stable.

As an additional advantage, there is no fluctuation in the gain by utilizing a method to control the current of each component in the saturated region, such as the power source voltage.

As a result of the adjustable gain taught by the present invention, the optimum gain and frequency band characteristics of amplifier 10 can be obtained.

Table 1 shows the results of a simulation of circuit 10 of FIG. 4. The designations in the process column of Table 1 as relates to P channel and N channel are as follows

|  | P channel | N channel |
|---|---|---|
| TYP | typical | typical |
| BCS | maximum | maximum |
| VOH | minimum | maximum |
| VOL | maximum | minimum |
| WCS | minimum | minimum |

Specifically, the designation for TYP is for instances where the mobility of the P channel transistor and N channel transistor both have typical values; BCS is for instance where the mobility of the P and N channels both are at their maximum values; VOH is for instances where the mobility of the P channel is at its smallest and the N channel is at its largest, and so on. Further, $V_{dd}$ is the power source voltage, $V_{com}$ (V) is the in-phase input voltage, and V dif. (mV) is the differential input voltage.

Table 1 shows that amplifier 10 has a small margin of variation and is very stable in spite of changes in temperature or current voltage. Also shown in Table 1, last line, amplifier 10 has reached a state of saturation because of the significant amount of differential input voltage V dif, and the gain Gv has become very small.

As mentioned above, adjustable gain differential amplifier 10 provides stable adjustable gain over a broad band-width with very slight changes in gain due to dispersions in processing, temperature changes, changes in power source voltage, and so on. With the completely balanced circuit configuration, the common mode rejection ratio is enlarged and the signal distortion is reduced. With the offset voltage lowered, a very high capacity circuit is achieved.

Thus there has been provided, in accordance with the present invention, a gain control differential amplifier that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

TABLE 1

| Process | Temp. | Vdd (v) | Vcom (v) | Vdif (mv) | Bw(MHz) | Gv(db) |
|---|---|---|---|---|---|---|
| TYP | 25 | 5.0 | 4.0 | 4.0 | 22.5 | 12.0 |
| TYP | 25 | 5.0 | 2.0 | 4.0 | 22.5 | 10.9 |
| BCS | 0 | 5.5 | 2.0 | 4.0 | 31.6 | 10.3 |
| BCS | 0 | 5.5 | 4.0 | 4.0 | 31.6 | 11.7 |
| VOH | 125 | 5.0 | 2.0 | 4.0 | 18.0 | 12.5 |
| VOH | 125 | 5.0 | 4.0 | 4.0 | 19.95 | 13.5 |
| VOL | 125 | 5.0 | 2.0 | 4.0 | 19.95 | 9.98 |
| VOL | 125 | 5.0 | 4.0 | 4.0 | 19.95 | 9.15 |
| WCS | 125 | 4.5 | 4.0 | 4.0 | 12.59 | 12.2 |
| WCS | 125 | 4.5 | 2.0 | 4.0 | 15.85 | 11.4 |
| WCS | 125 | 4.5 | 4.0 | 0.01 | 12.59 | 12.2 |
| WCS | 125 | 4.5 | 4.0 | 0.1 | 12.59 | 12.2 |
| WCS | 125 | 4.5 | 4.0 | 1.0 | 12.59 | 12.2 |
| WCS | 125 | 4.5 | 4.0 | 10.0 | 12.59 | 12.2 |
| WCS | 125 | 4.5 | 4.0 | 100.0 | 22.50 | 4.93 |

I claim:

1. An adjustable gain differential amplifier comprising:
   a balanced gain amplifier having a plurality of outputs;
   said balanced gain amplifier having an output current wherein the value of said output current is equal at each of said plurality of outputs;
   a means for controlling gain in said balanced gain amplifier, said means for controlling comprising a voltage generator and a temperature stable variable current source;
   said temperature stable variable current source driving a variable current through said voltage generator;
   a first control bias (VDD) coupled to said balanced gain amplifier and said voltage generator;
   said voltage generator supplying a voltage to said balanced gain amplifier;
   said balanced gain amplifier comprising a current generator to generate said output current; and
   a gain of said balanced gain amplifier which is output at said plurality of outputs determined according to the ratio of said output current and said variable current from said temperature stable variable current source.

2. An adjustable gain differential amplifier according to claim 1 wherein said balanced gain amplifier comprises:
   a plurality of transistors coupled to said voltage generator of said means for controlling gain;
   each of said plurality of transistors coupled to one each of said plurality of outputs; and
   each of said plurality of outputs further coupled to said first control bias.

3. An adjustable gain differential amplifier according to claim 1 wherein said voltage generator comprises:
   at least one transistor;
   said at least one transistor coupled to said first control bias and to said temperature stable variable current source; and
   said at least one transistor further coupled to said balanced gain amplifier.

4. An adjustable gain differential amplifier according to claim 1 wherein said temperature stable variable current source comprises:
   a plurality of current generators;
   interrupt means for activating any or all of said plurality of current generators, said variable current maintained, increased, or decreased as desired by the operation of said interrupt means;
   said interrupt means coupled to said voltage generator; and
   each of said plurality of current generators coupled to said interrupt means.

* * * * *